United States Patent
Meyer et al.

(10) Patent No.: US 9,553,231 B2
(45) Date of Patent: Jan. 24, 2017

(54) SEMICONDUCTOR LAYER SEQUENCE AND METHOD OF OPERATING AN OPTOELECTRONIC SEMICONDUCTOR CHIP

(71) Applicant: OSRAM Opto Semiconductors GmbH, Regensburg (DE)

(72) Inventors: Tobias Meyer, Ihrlerstein (DE); Jürgen Off, Regensburg (DE)

(73) Assignee: OSRAM Opto Semiconductors GmbH (DE)

(*) Notice: Subject to any disclaimer, the term of this patent is extended or adjusted under 35 U.S.C. 154(b) by 0 days.

(21) Appl. No.: 14/769,831

(22) PCT Filed: Apr. 11, 2014

(86) PCT No.: PCT/EP2014/057414
§ 371 (c)(1),
(2) Date: Aug. 24, 2015

(87) PCT Pub. No.: WO2014/177367
PCT Pub. Date: Nov. 6, 2014

(65) Prior Publication Data
US 2016/0087142 A1    Mar. 24, 2016

(30) Foreign Application Priority Data

Apr. 29, 2013  (DE) .................. 10 2013 104 351

(51) Int. Cl.
*H01L 33/00* (2010.01)
*H01L 33/06* (2010.01)
(Continued)

(52) U.S. Cl.
CPC ............... *H01L 33/06* (2013.01); *H01L 33/32* (2013.01); *H01S 5/1096* (2013.01);
(Continued)

(58) Field of Classification Search
CPC .. H01S 5/1096; H01S 5/34333; H01S 5/3408; H01S 5/3086; H01L 33/06; H01L 33/32; H01L 33/08; H05B 33/0803; H05B 33/0857
See application file for complete search history.

(56) References Cited

U.S. PATENT DOCUMENTS

| 2003/0197188 A1 | 10/2003 | Watatani et al. |
| 2007/0284564 A1 | 12/2007 | Biwa et al. |
| 2011/0089399 A1 | 4/2011 | Chakraborty et al. |

FOREIGN PATENT DOCUMENTS

| DE | 199 55 747 A1 | 5/2001 |
| DE | 10 2005 035 722 A1 | 2/2007 |

(Continued)

OTHER PUBLICATIONS

A.Y. Kin et al., "Performance of High-Power AlInGaN Light Emitting Diodes," Phys. Stat. Sol. (a), vol. 188, No. 1, pp. 15-21 (2001).

(Continued)

*Primary Examiner* — Nikolay Yushin
(74) *Attorney, Agent, or Firm* — DLA Piper LLP (US)

(57) ABSTRACT

The semiconductor layer sequence includes an n-conductive layer, a p-conductive layer and an active zone located therebetween. The active zone comprises N quantum wells with N≥2. At a first working point (W1) at a first current density, the quantum wells have a first emission wavelength and, at a second working point (W2) at a second current density, a second emission wavelength. At least two of the first emission wavelengths differ from one another and at least some of the second emission wavelengths differ from the first emission wavelengths. The first current density is smaller than the second current density and the current densities differ from one another at least by a factor of 2.

14 Claims, 7 Drawing Sheets

(51) Int. Cl.
*H01S 5/10* (2006.01)
*H01S 5/343* (2006.01)
*H01S 5/34* (2006.01)
*H01L 33/32* (2010.01)
*H05B 33/08* (2006.01)
*H01L 33/08* (2010.01)
*H01S 5/30* (2006.01)

(52) U.S. Cl.
CPC ........ *H01S 5/3408* (2013.01); *H01S 5/34333* (2013.01); *H05B 33/0803* (2013.01); *H01L 33/08* (2013.01); *H01S 5/3086* (2013.01)

(56) References Cited

FOREIGN PATENT DOCUMENTS

| DE | 10 2006 025 964 A1 | 12/2007 |
| DE | 10 2007 044 439 A1 | 3/2009 |
| DE | 10 2007 058 723 A1 | 3/2009 |
| DE | 10 2007 046 027 A1 | 4/2009 |
| DE | 10 2008 059 151 A1 | 7/2009 |
| DE | 10 2009 015 569 A1 | 10/2010 |
| DE | 10 2011 115 312 A1 | 4/2013 |
| EP | 0 661 782 A1 | 7/1995 |
| GB | 2 212 325 A | 7/1989 |
| JP | 10-27925 A | 1/1998 |
| JP | 2000-261106 A | 9/2000 |
| JP | 2004-179428 A | 6/2004 |

OTHER PUBLICATIONS

Jiang-Yong Zhang et al., "Efficient hole transport in asymmetric coupled InGaN multiple quantum wells," Applied Physics Letters, vol. 97, pp. 161110-1-161110-3 (2009).

C.H. Wang et al., "Efficiency droop alleviation in InGaN/GaN light-emitting diodes by graded-thickness multiple quantum wells," Applied Physics Letters, vol. 97, pp. 181101-1-181101-3 (2010).

SEMICONDUCTOR LAYER SEQUENCE AND METHOD OF OPERATING AN OPTOELECTRONIC SEMICONDUCTOR CHIP

TECHNICAL FIELD

This disclosure relates to a semiconductor layer for an optoelectronic semiconductor chip and a method of operating such an optoelectronic semiconductor chip.

BACKGROUND

There is a need for a semiconductor layer sequence that exhibits elevated efficiency over a wide operating current range.

SUMMARY

We provide a semiconductor layer sequence for an optoelectronic semiconductor chip, which sequence includes an n-conductive layer; a p-conductive layer; and an active zone located therebetween, wherein the active zone includes N successive quantum wells along a growth direction (G) with N≥2 and N∈ℕ, which each generate radiation and are consecutively numbered along the growth direction (G) with k∈[1; N]ℕ; the quantum wells are separated from one another by barrier layers; at a first working point (W1) at a first current density (C1), the quantum wells exhibit associated, consecutively numbered first emission wavelengths $L1_k$; at least two of the first emission wavelengths $L1_k$ of the quantum wells differ from one another; at a second working point (W2) at a second current density (C2), the quantum wells exhibit associated, consecutively numbered second emission wavelengths $L2_k$, at least some of which differ from the first emission wavelengths $L1_k$; the first current density (C1) is smaller than the second current density (C2) and the current densities (C1, C2) differ from one another at least by a factor of 2; and for at least one i and at least one j with i, j∈[1; N]ℕ and i≠j, the following applies: $L1_i < L1_j$; the first current density (C1) is at most 3.5 A/cm² and the second current density (C2) at least 10 A/cm²; the quantum wells are based on InGaN; thicknesses (T) of the quantum wells are each 1.5 nm and 5 nm; thicknesses (B) of the barrier layers are each 3 nm to 12 nm and the barrier layers are based on GaN, AlGaN or InGaN; 10≥N≥4; at the second working point (W2) for at least one i and at least one j, the following applies: $L2_i > L2_j$; for at least one i and at least one j a wavelength difference between $L1_i$ and $L1_j$ at the first working point (W1) is 1.5 nm to 12 nm; for at least one i and at least one j a wavelength difference between $L2_i$ and $L2_j$ at the second working point (W2) is 0.5 nm to 6 nm; at the first working point (W1) the emission wavelengths $L1_k$ of the quantum wells increase monotonically or strictly monotonically from the n-conductive layer towards the p-conductive layer and then decline monotonically or strictly monotonically towards the p-conductive layer; and the average thicknesses of the quantum wells in the active zone vary by a first factor of at least 1.2 and of at most 1.5 and the indium contents of the quantum wells in the active zone vary by a second factor of at least 1.005 and of at most 1.2.

We also provide a method in which the optoelectronic semiconductor chip with the semiconductor layer sequence is operated including periodically operating the semiconductor layer sequence at the first working point (W1) at the first current density (C1) and periodically at the second working point (W2) at the second current density (C2), wherein the first current density (C1) is smaller than the second current density (C2) and the current densities (C1, C2) differ from one another at least by a factor of 2; and for at least one i and at least one j with i, j∈[1; N]ℕ and i≠j, the following applies: $L1_i < L1_j$ and $L2_i \geq L2_j$.

We further provide a semiconductor layer sequence for an optoelectronic semiconductor chip, which sequence includes an n-conductive layer; a p-conductive layer; and an active zone located therebetween, wherein the active zone includes N successive quantum wells along a growth direction (G) with N≥2 and N∈ℕ, each generating radiation and consecutively numbered along the growth direction (G) with k∈[1; N]ℕ; the quantum wells are separated from one another by barrier layers; at a first working point (W1) at a first current density (C1), the quantum wells exhibit associated, consecutively numbered first emission wavelengths $L1_k$; at least two of the first emission wavelengths $L1_k$ of the quantum wells differ from one another; at a second working point (W2) at a second current density (C2), the quantum wells exhibit associated, consecutively numbered second emission wavelengths $L2_k$, at least some of which differ from the first emission wavelengths $L1_k$; the first current density (C1) is smaller than the second current density (C2) and the current densities (C1, C2) differ from one another at least by a factor of 2; and for at least one i and at least one j with i, j∈[1; N]ℕ and i≠j, the following applies: $L1_i < L1_j$ and $L2_i \geq L2_j$.

LIST OF REFERENCE SIGNS

1 Optoelectronic semiconductor chip
2 Semiconductor layer sequence
21 n-Conductive layer
22 p-Conductive layer
3 Active zone
33 Quantum well
34 Barrier layer
4 Carrier
5 Mirror
B Thickness of barrier layers
C Current density
E Emission energy
G Growth direction
i Count index
I Intensity
L Emission wavelength
T Thickness of quantum wells
Q External quantum efficiency
W Working point

DETAILED DESCRIPTION

The semiconductor layer sequence is intended for an optoelectronic semiconductor chip. The semiconductor chip is preferably a light-emitting diode or also a laser diode. In particular, the semiconductor layer sequence is designed to generate near-ultraviolet, visible or near-infrared radiation.

Radiation, for example, in the spectral range of 340 nm to 1300 nm, specifically 400 nm to 520 nm, may accordingly be generated in the semiconductor layer sequence.

The semiconductor layer sequence may comprise an n-conductive layer, a p-conductive layer and an active zone located therebetween. For simplicity's sake, these are referred to as an n-conductive and a p-conductive layer. These layers may however also have the structure of a layer stack with a plurality of sublayers. The entire semiconductor layer sequence is preferably based on the same material system.

The semiconductor layer sequence is preferably based on a III-V compound semiconductor material. The semiconductor material is, for example, a nitride compound semiconductor material such as $Al_nIn_{1-n}Ga_mN$ or a phosphide compound semiconductor material such as $Al_nIn_{1-n}Ga_mP$ or also an arsenide compound semiconductor material such as $Al_nIn_{1-n-m}Ga_mAs$, wherein in each case $0 \leq n \leq 1$, $0 \leq m \leq 1$ and $n+m \leq 1$ applies. The semiconductor layer sequence may comprise dopants and additional constituents. For simplicity's sake, however, only the substantial constituents of the crystal lattice are indicated, i.e., Al, As, Ga, In, N or P, even if these may in part be replaced and/or supplemented by small quantities of further substances. The semiconductor layer sequence is preferably based on $Al_nIn_{1-n-m}Ga_mN$.

The active zone may comprise a plurality of successive quantum wells along a growth direction of the semiconductor layer sequence. In particular, the active zone comprises two, three, four or more than four quantum wells. Each of these quantum wells of the active zone is designed to generate radiation. The active zone thus comprises N quantum wells with $N \geq 2$ or $N \geq 4$ and $N \in \mathbb{N}$. The quantum wells are numbered consecutively parallel or antiparallel to a growth direction with $k \in [1; N] \mathbb{N}$.

The quantum wells in the active zone may be separated from one another by barrier layers. It is possible for each of the quantum wells to directly adjoin two of the barrier layers and/or for an alternating, preferably direct succession of quantum wells and barrier layers to be formed.

The quantum wells may have first emission wavelengths at a first working point, specifically at a first current density. At the first current density, the quantum wells may have the same emission wavelength or also have mutually differing emission wavelengths. Emission wavelength is taken to mean that wavelength at which a maximum spectral energy density is emitted. The emission wavelength is also referred to as peak wavelength. The first emission wavelengths are hereinafter also denoted $L1_k$, the first emission wavelength $L1_k$ being assigned to the $k^{th}$ quantum well.

At least two of the first emission wavelengths of the quantum wells differ may from one another at the first working point. This means that, for at least one i and at least one j with i, $j \in [1; N] \mathbb{N}$ and $i \neq j$, the following applies: $L1_i \neq L1_j$. It is possible for all the first emission wavelengths of the quantum wells to differ from one another in pairs at the first working point.

The quantum wells may have second emission wavelengths at a second working point, specifically at a second current density. The second emission wavelengths are also denoted $L2_k$, the second emission wavelength $L2_k$ being assigned to the $k^{th}$ quantum well. All or at least some of the second emission wavelengths differ from the first emission wavelengths at the first working point. This means that, for at least one i or for all i and for at least one j with i, $j \in [1; N]$ $\mathbb{N}$ and $i \neq j$, the following applies: $L1_i \neq L2_i$ and/or $L2_i \neq L2_j$. In other words, the emission wavelength of the quantum wells or at least some of the quantum wells changes from the first working point to the second working point.

Specifically, the first current density at the first working point is less than the second current density at the second working point. The first and the second current density differ from one another at least by a factor of 2 or 5 or 7 or 10.

At the first working point, at least one of the first emission wavelengths may be greater than or equal to one of the second emission wavelengths. Thus, for at least one i and at least one j with i, $j \in [1; N] \mathbb{N}$ and $i \neq j$ or $i = j$, the following applies: $L1_i \geq L2_j$. In other words, the emission wavelengths initially differ from one another and a difference between the emission wavelengths of the quantum wells in question changes sign or disappears towards the second working point.

The semiconductor layer sequence may be intended for an optoelectronic semiconductor chip. The semiconductor layer sequence comprises an n-conductive layer, a p-conductive layer and an active zone located therebetween. The active zone comprises N quantum wells in succession along a growth direction with $N \geq 2$, N being a natural number. The quantum wells are in each case designed to generate radiation, are separated from one another by barrier layers and consecutively numbered with k along a growth direction. The quantum wells each have a first emission wavelength at a first working point at a first current density and each have a second emission wavelength at a second working point at a second current density. At least two of the first emission wavelengths differ from one another and at least some of the second emission wavelengths differ from the first emission wavelengths. The first current density is smaller than the second current density and the current densities differ from one another at least by a factor of 2. At least one of the first emission wavelengths of a specific first quantum well is greater than another of the first emission wavelengths of another, second quantum well. At the second working point, the second emission wavelength of this first quantum well is less than or equal to the second emission wavelengths of the second quantum well such that any difference between these first and second emission wavelengths of these first and second quantum wells disappears or changes sign towards the second working point. In other words, for at least one i and at least one j with i, $j \in [1; N] \mathbb{N}$ and $i \neq j$, the following applies: $L1_i < L1_j$ and $L2_i \geq L2_j$, wherein the first emission wavelengths $L1$ and the second emission wavelengths $L2$ are consecutively numbered along the growth direction and i, j are count indices.

A charge carrier distribution, in particular of charge carriers described as positive such as holes, is generally non-homogeneous in particular in InGaN-based light-emitting diodes with a plurality of quantum wells due to poor charge carrier mobility, specifically over barriers between the quantum wells. At elevated current densities, this may result not only in losses in efficiency, but also in unwanted broadening of the emission spectra and major changes in wavelength in the event of changes in current or temperature.

Because the quantum wells have different energy levels, which is also known as chirp, the charge carriers can be better distributed between the individual quantum wells. The density of charge carriers, specifically of holes, may accordingly be increased in quantum wells with a lower energy level. The energy levels of the quantum wells may in particular be adjusted by the thickness of the quantum wells and/or by the material composition of the quantum wells or also of the barrier layers.

Because at least some of the energy levels of the quantum wells in the semiconductor layer sequence described here differ at the working points, it is possible to adjust charge carrier distribution at the working point. As a consequence, a higher efficiency is possible over a relatively large range of variation with regard to current density and/or also temperature as operating parameters. Current-dependent and temperature-dependent charge carrier distribution in the multiple quantum well structure may thus additionally be controlled by the emission energies and energy levels of the quantum wells being adjustable relative to one another in current- and/or temperature-dependent manner.

The first current density may be at most 2.0 A/cm$^2$ or 5 A/cm$^2$ or 20 A/cm$^2$. Alternatively or additionally, the first current density is at least 0.1 A/cm$^2$ or 1.0 A/cm$^2$.

The second current density may amount to at least 5 A/cm$^2$ or 10 A/cm$^2$ or 20 A/cm$^2$ or 35 A/cm$^2$ or 50 A/cm$^2$. Alternatively or additionally, the second current density is at most 1100 A/cm$^2$ or 800 A/cm$^2$ or 300 A/cm$^2$.

All the quantum wells may be based on InGaN or on AlInGaN. In other words, the substantial material constituents of the quantum wells are indium, aluminium, gallium and nitrogen. In addition to those constituents, it is possible for the quantum wells to comprise further constituents, but merely in doping concentrations. For example, all the further constituents taken together have a concentration of at most $1 \times 10^{22}$ cm$^{-3}$ or $1 \times 10^{21}$ cm$^{-3}$ or $1 \times 10^{20}$ cm$^{-3}$.

All the quantum wells or at least some of the quantum wells may have a thickness of at least 1.0 nm or 1.5 nm or 2.0 nm or 2.5 nm. Alternatively or additionally, the thicknesses of all or at least some of the quantum wells is at most 12 nm or 8 nm or 6 nm or 5 nm or 4 nm or 3.5 nm.

The barrier layers or at least some of the barrier layers may each have a thickness of at least 1.5 nm or 2.5 nm or 3 nm or 4 nm and/or of at most 20 nm or 12 nm or 10 nm or 8 nm or 6 nm. The barrier layers preferably directly adjoin the adjacent quantum wells.

The barrier layers or at least some of the barrier layers may be based on GaN, AlGaN, AlInGaN or InGaN. The barrier layers may also comprise additional material components in the form of doping or other elements such as carbon, oxygen or antimony. The statements made in this respect regarding the quantum wells apply mutatis mutandis.

The semiconductor layer sequence may comprise at most 20 or ten or eight or seven or six of the quantum wells intended to generate radiation. Additional quantum wells not intended to generate radiation may also be present.

There may be a wavelength difference between one of the first emission wavelengths and another of the first emission wavelengths at the first working point of at least 1.5 nm or 2 nm or 2.5 nm or 3.0 nm. Alternatively or additionally, the wavelength difference is at most 30 nm or 12 nm or 8 nm or 4.5 nm. The wavelength difference between the second emission wavelengths of the associated quantum wells at the second working point is at least 0.5 nm or 1.0 nm and/or at most 6 nm or 5 nm or 4 nm.

At the first working point the emission wavelengths of the quantum wells may increase monotonically or strictly monotonically from the n-conductive layer towards the p-conductive layer. For example, the emission wavelengths have a linear or parabolic profile towards the p-conductive layer.

At the first working point the emission wavelengths may increase first monotonically or strictly monotonically from the n-conductive layer towards the p-conductive layer and then decline monotonically or strictly monotonically towards the p-conductive layer. The profile of the emission wavelengths towards the p-conductive layer may thus be approximately V-shaped or U-shaped in form.

At the second working point the emission wavelengths may have a different profile in the direction from the n-conductive layer towards the p-conductive layer than at the first working point. For example, at the second working point the emission wavelengths decline monotonically or strictly monotonically towards the p-conductive layer. It is likewise possible for the emission wavelengths at the second working point to decline parabolically towards the p-conductive layer.

The average thicknesses of the quantum wells in the active zone may vary by at least 0.1 nm or 0.3 nm or 0.5 nm or 0.6 nm and/or by at most 5 nm or 2.5 nm or 1.5 nm or 1.1 nm. Each of the quantum wells is assigned exactly one average thickness. The average thickness is in particular calculated across an entire lateral extent of the quantum wells. Lateral means in a direction perpendicular to a growth direction of the semiconductor layer sequence.

The indium content of the quantum wells in the active zone may vary by at least 0.06 atom percent or 0.1 atom percent or 0.15 atom percent and/or by at most 6 atom percent or 2 atom percent or 1 atom percent or 0.5 atom percent. The indium content relates to the atom percent content of indium averaged over the entire quantum well. The atom percent values relate to the proportion of gallium atoms of the InGaN quantum wells which is replaced by indium atoms. The absolute indium content is preferably at least 10% or 15% or 17% and/or at most 50% or 30% or 20% or 18%. An indium content of, for example, 17% means x has a value of 0.17 in the formula In$_x$Ga$_{1-x}$N.

The average thickness of the quantum wells in the active zone may vary by a first factor of at least 1.05 or 1.1 or 1.2 or 1.25 and/or of at most 3 or 2 or 1.5 or 1.35.

The indium contents of the quantum wells in the active zone may vary by a second factor of at least 1.001 or 1.003 or 1.004 or 1.005 and/or of at most 2 or 1.4 or 1.2 or 1.015 or 1.008.

The quantum wells in the active zone may be doped to different degrees. Doping of the quantum wells then varies, for example, by at least $1 \times 10^{18}$/cm$^3$ or $2 \times 10^{18}$/cm$^3$ and/or by at most $5 \times 10^{19}$/cm$^3$ or $1 \times 10^{19}$/cm$^3$. Doping may differ both in dopant concentration and also alternatively or additionally in the type of doping, i.e., p-doped or n-doped. The quantum wells or some of the quantum wells are, for example, doped with silicon or with magnesium, and the same may apply to barrier layers and sublayers of the barrier layers. In contrast thereto, it is also possible for all or at least some of the quantum wells to be undoped. Undoped may mean that a foreign substance concentration does not exceed a value of $5 \times 10^{17}$/cm$^3$ or $1 \times 10^{17}$/cm$^3$ or $5 \times 10^{16}$/cm$^3$.

Two or more than two of the barrier layers in the active zone may be doped to different degrees. With regard to dopant concentration and type of doping, the same applies to the barrier layers as to the quantum wells. Doping the barrier layers may vary the emission wavelengths of the quantum wells at the first working point and/or at the second working point. When using differently doped barrier layers it is possible for the quantum wells to be in each case of identical configuration within the bounds of manufacturing tolerances.

Some of the barrier layers may be based on AlGaN and others of the barrier layers are based on InGaN, AlN, AlInGaN or on GaN. In AlGaN, the aluminium content of the barrier layers is preferably at least 0.1% or 0.5% or 1% or 3% and/or at most 50% or 20% or 10% or 8%, in each case relative to Ga. The same is true of the indium content in InGaN barrier layers and of the content of each individual component in AlInGaN barrier layers. The barrier layers may each comprise a plurality of sublayers, which may have different contents of the components Al, In and/or Ga and differ in their doping.

A method of operating an optoelectronic semiconductor chip is additionally provided, the semiconductor chip comprising a semiconductor layer sequence, as described in relation to one or more of the above-stated examples. Features of the semiconductor layer are therefore also disclosed for the method and vice versa.

The semiconductor layer sequence may sometimes be operated at the first working point and sometimes at the second working point. At the first working point the first current density is present and at the second working point the second current density is present.

A wavelength profile of an emission wavelength from a first one of the quantum wells may intersect with a wavelength profile of an emission wavelength from a second one of the quantum wells, as a function of the current density and if the current density is increased from the first working point towards the second working point. This intersection of the emission wavelength profiles preferably applies in pairs with regard to the emission wavelength from at least two or from more than two or from all the quantum wells.

When the current density increases from the first towards the second working point, the mobility of positive charge carriers such as holes across a barrier may decrease in the active zone of the semiconductor layer sequence. Mobility, in particular of the holes, across a barrier is thus adjusted as a function of current density. This is made possible specifically by the described structure of the semiconductor layer sequence.

A semiconductor layer sequence described here and a method described herein will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

Figure 1:
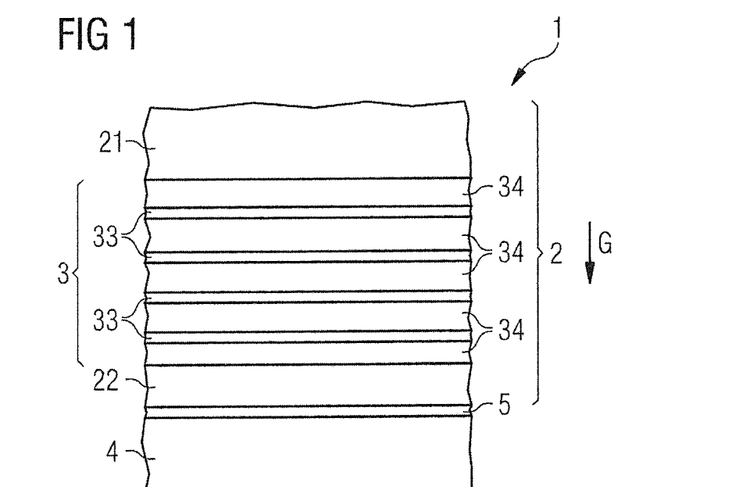
FIG. 1 is a schematic sectional representation of an example of a semiconductor layer sequence.

FIG. 1 is a sectional representation of an example of an optoelectronic semiconductor chip 1 with a semiconductor layer sequence 2. The semiconductor chip 1 is, for example, a light-emitting diode.

A mirror 5 is optionally mounted on a carrier 4 which supports and mechanically bears the semiconductor layer sequence 2. The mirror 5 may be a metal mirror, which may be provided at the same time as current input into the semiconductor layer sequence 2. Unlike in the illustration, the mirror 5 may comprise a plurality of layers. The mirror 5 may also be mounted on a side of the semiconductor layer sequence 2 remote from the carrier 4.

The semiconductor layer sequence 2 comprises a p-conductive layer 22 and an n-conductive layer 21 and an active zone 3, which lies between these layers 21, 22 and is in contact with these layers 21, 22. To simplify the illustration, the layers 21, 22 are each shown as a single layer. In contrast thereto, the layers 21, 22 may also be composed of a plurality of sublayers and/or mounted or grown in reverse sequence on the carrier 4.

According to FIG. 1, the active zone comprises four quantum wells 33 designed to generate radiation when the semiconductor chip 1 is in operation, in particular to generate blue light. A different number of quantum wells 33 may likewise be present. The quantum wells 33 are each based, for example, on InGaN. The quantum wells 33 are arranged alternately with barrier layers 34. The barrier layers 34 and the quantum wells 33 may be arranged in direct succession. The barrier layer 34 closest to the p-conductive layer 22 and/or furthest from the p-conductive layer 22 is optional.

It is additionally possible for roughening to be formed in the n-conductive layer 21 on a side remote from the carrier 4 to improve light outcoupling. In a further option, conversion materials may be mounted in or on the semiconductor layer sequence 2, which materials convert at least some of the radiation generated in the active zone 3 into radiation of a different wavelength.

The quantum wells 33 and/or the barrier layers 34 may comprise different material compositions and/or thicknesses. The barrier layers 34 are preferably each thicker than the quantum wells 33. The material composition and the thickness within the respective quantum wells 33 and barrier layers 34 preferably do not vary or do not vary significantly in a direction perpendicular to a growth direction G of the semiconductor layer sequence 2.

In contrast thereto, the material composition and/or doping of the quantum wells 33 and/or of the barrier layers 34 may also be purposefully varied in the growth direction G. The material composition and/or doping may also vary in particular moderately in the direction perpendicular to the growth direction G. It is in each case possible for the quantum wells 33 and/or the barrier layers 34 to be assembled from a plurality of sublayers. At variance with the illustration in FIG. 1, the growth direction G may also extend from the p-conductive layer 22 to the n-conductive layer 21.

Figure 2A:
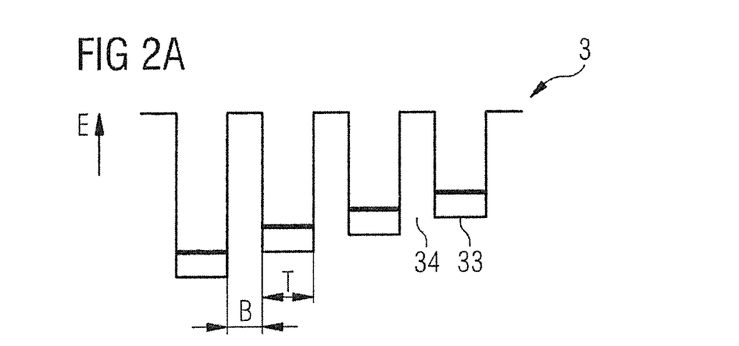
FIGS. 2A-2B, 3A-3B, 4A-4B, 5A-5C, 6, 7 and 8A-8D are schematic diagrams of parameters of active zones for semiconductor layer sequences.
Figure 2B:
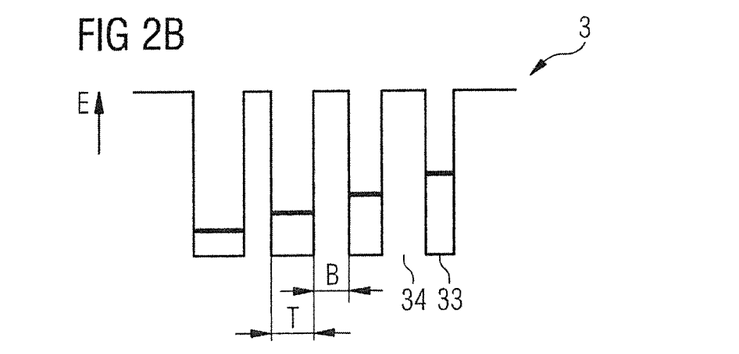

FIG. 2 is a schematic representation of energy levels of the quantum wells 33 in the active zone 3. The higher the energy level shown, the shorter the wavelength emitted by the associated quantum well 33.

According to FIG. 2A, the quantum wells 33 each have identical thicknesses T. The barrier layers 34 also have identical thicknesses B. The energy levels in the quantum wells 33 are adjusted by varying an indium content. The energy levels of the quantum wells 33 have a linear profile, as in FIG. 2B.

According to FIG. 2B, the indium content of the quantum wells 33 is constant, but the quantum wells 33 have different thicknesses. The thinner the corresponding quantum well 33, the higher the associated energy level. The barrier layers 34 may likewise have different thicknesses or, unlike in FIG. 2B, be of identical thickness.

At variance with the representation according to FIG. 2, it is also possible for both the indium content and the thickness of the quantum wells 33 to be varied within the active zone 3 to adjust energy levels. Furthermore, the quantum wells 33 may be differently doped, with regard to both doping type and dopant concentration.

Moreover, doping of the barrier layers 34 upstream and/or downstream of one quantum well 33 may be higher than upstream and/or downstream of another of the quantum wells 33. Likewise, type of doping, i.e., n-doping or p-doping, of the barrier layers 34 may differ from one another upstream and/or downstream of different quantum wells 33. Thus, adjustment of the energy levels is also possible by the barrier layers 34, as an alternative or in addition to the configuration of the quantum wells 33.

Figure 3A:
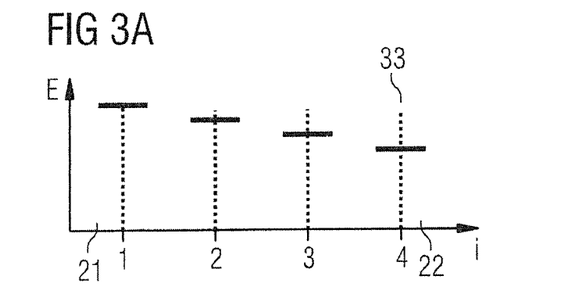
Figure 3B:
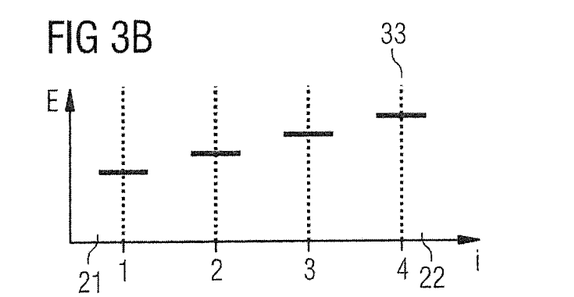

FIG. 3 shows the energy levels as horizontal dashes and the density of positive charge carriers, i.e., of holes, is shown as dotted lines. The quantum wells 33 are numbered with ascending numbering with a count index i running from the n-conductive layer 21 to the p-conductive layer 22. The quantum wells 33 are plotted against the energy E of the energy levels.

FIG. 3A shows a low-current range. Relatively high hole mobility across a barrier is provided and the holes are well distributed. Clustering of the holes at the n-conductive layer 21 is prevented by ascending energy levels of the quantum wells 33. The energy levels of the quantum wells thus increase continuously from the p-conductive layer 22 to the n-conductive layer 21.

FIG. 3B shows the high-current range with high current densities. There is relatively low hole mobility across a barrier. Clustering of positive charge carriers at the p-conductive layer 22 is prevented by declining energy levels of the quantum wells 33. The energy levels fall in the direction from the p-conductive layer 22 towards the n-conductive layer 21.

Figure 4A:
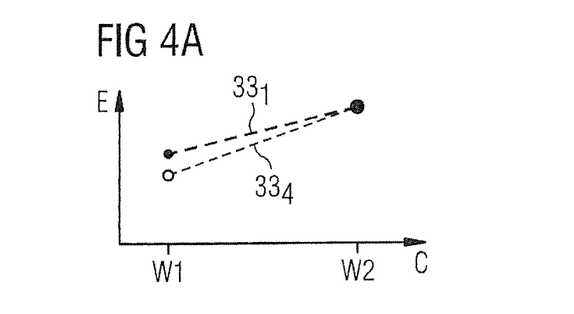
Figure 4B:
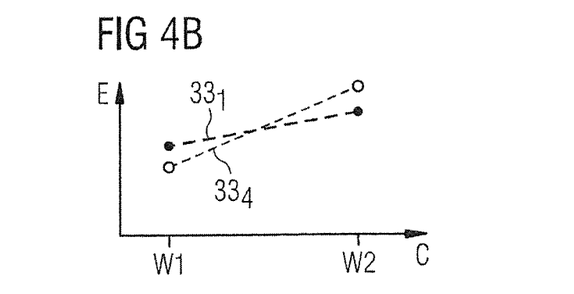

In FIG. 4 the energy E of the quantum wells 33 is plotted as a function of current density C, which corresponds to a charge carrier density. The greater the energy E, the shorter the associated emission wavelength. At a first working point W1, the energy levels of the quantum wells 33 are lower than at a second working point W2 with a greater current density C. Towards the second working point W2, the emission energies E move closer together as shown in FIG. 4A.

According to FIG. 4B, the emission energy profiles of the quantum wells 33 intersect in the direction from the first working point W1 towards the second working point W2. In other words, a difference in the energies of the quantum wells indicated $33_1$, $33_4$ changes sign.

Figure 5A:
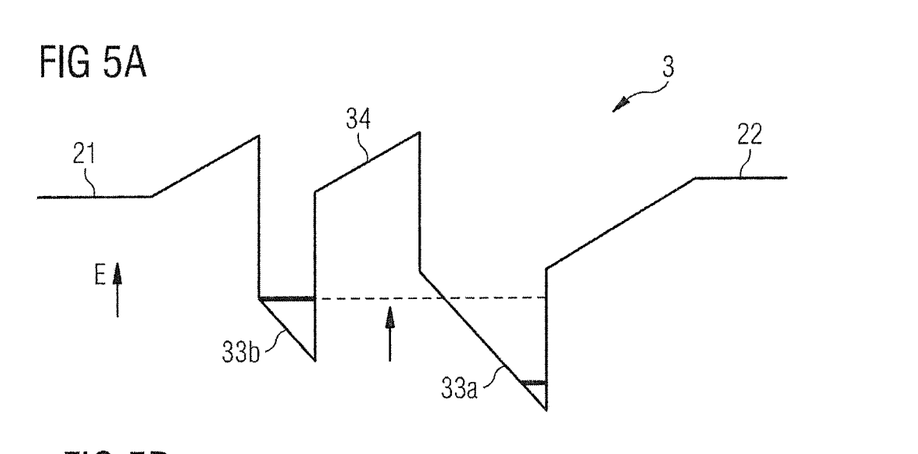
Figure 5B:
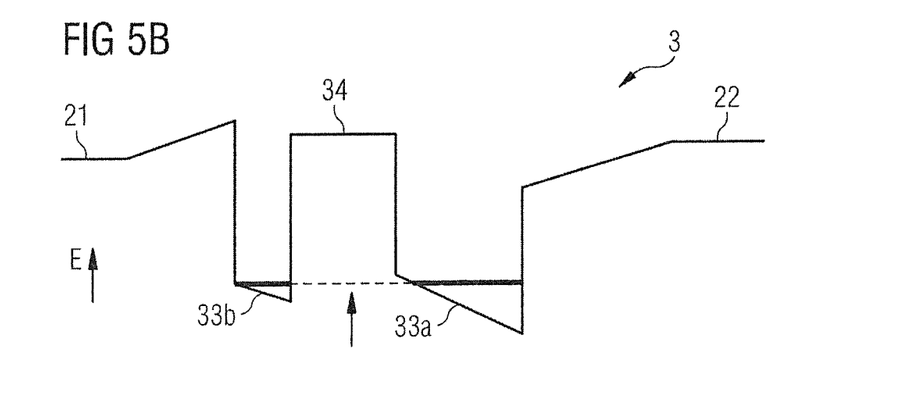
Figure 5C:
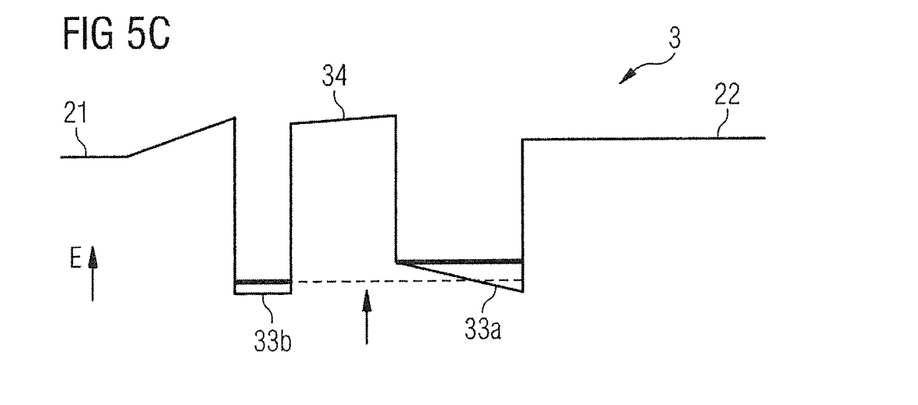

FIG. 5 is a highly schematic representation of an energy band model of the energy levels at various current densities. In FIG. 5A a low current density is present, in FIG. 5B a moderate current density and in FIG. 5C a high current density.

The quantum well 33a has a greater thickness and a smaller indium content than the quantum well 33b, which is closer to the n-conductive layer 21. The thinner quantum well 33b has a thickness of 2.0 nm and an indium content of 20.2%, the thicker quantum well 33a has a thickness of 4.0 nm and an indium content of 15.6%. These thicknesses and indium contents may be present, for example, with a tolerance of at most 20% or 10%.

In the event of an increase in current density, the band structure changes and as a consequence the relative location of the energy levels of the quantum wells 33a, 33b relative to one another also changes.

Figure 6:
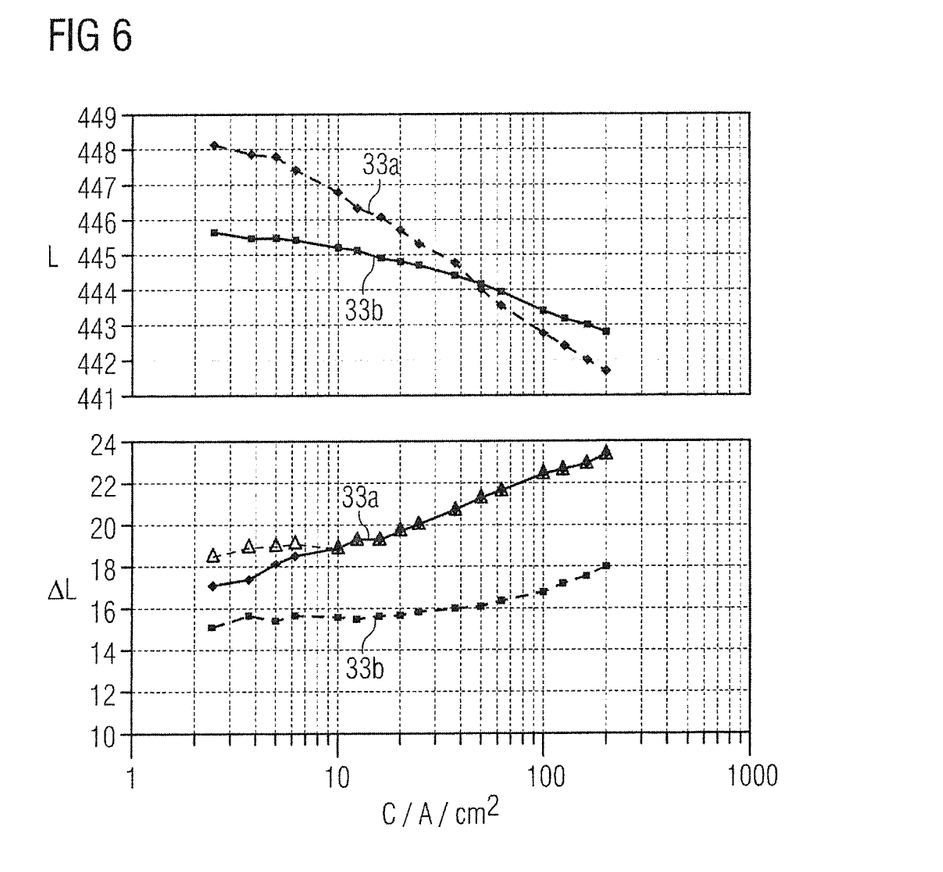

FIG. 6 shows an emission wavelength L in the upper part of the figure and a spectral half-value width ΔL in the lower part of the figure as a function of current density C. The quantum wells 33a which emit at a longer wavelength at low current densities have a greater thickness than the quantum wells 33b. The thicknesses differ from one another, for example, by a factor of 1.3, the smaller thickness in particular being between 2.8 nm and 3.5 nm and an indium content of the quantum wells 33a, 33b, for example, being 16.4% to 17.0%. These values are, for example, met with a tolerance of at most 20% or 10%. At low current densities C up to approximately 4 A/cm$^2$, the difference in emission wavelengths is roughly 2.5 nm. Above current densities of roughly 4 A/cm$^2$ up to a current density of roughly 35 A/cm$^2$, the emission wavelengths move closer together. At still higher current densities C, the profiles of the emission wavelengths intersect and the thicker quantum wells 33a emit at shorter wavelengths than the thinner quantum wells 33b.

The lower part of FIG. 6 shows that the spectral half-value width ΔL increases with rising current density C. The thicker quantum wells 33a here have a larger spectral half-value width ΔL. If the half-value widths ΔL of the quantum wells 33a, 33b are superimposed, in the low-current range below roughly 10 A/cm$^2$, the spectral half-value width increases. At higher current densities, however, overall there is less broadening of the half-value width in the event of a change in current density C, relative to lower current densities. The emitted spectrum thus appears constant over a relatively large current range. Moreover, the effects of the shift in emission wavelength and half-value width ΔL partially offset one another and therefore a more uniform emission pattern can be achieved.

Figure 7:
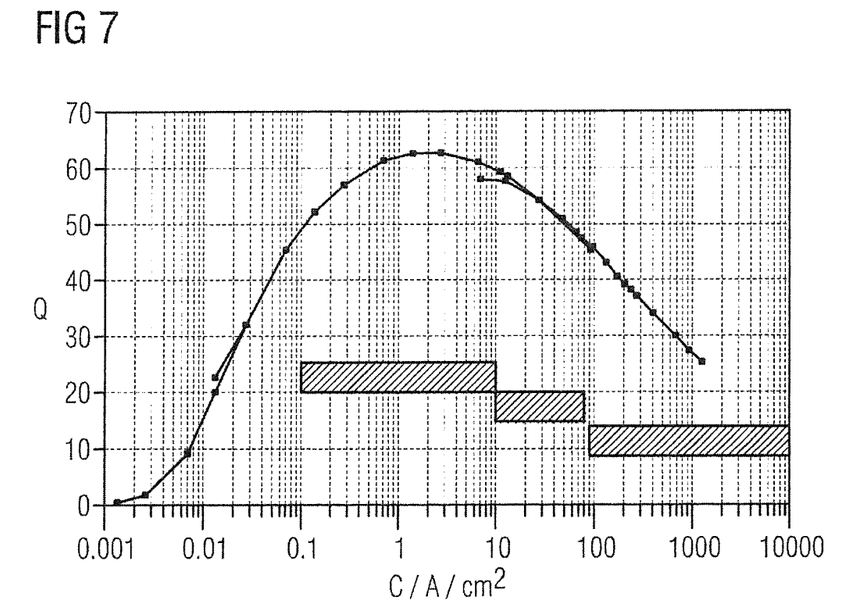

In FIG. 7, an external quantum efficiency Q in arbitrary units is plotted against current density C. The bars indicate a low-current range up to 10 A/cm$^2$, a normal range between 10 A/cm$^2$ and 85 A/cm$^2$ and a high-current range above 85 A/cm$^2$. Towards relatively high current densities, from roughly 3 A/cm$^2$, quantum efficiency declines. By using quantum wells with different emission wavelengths, this decline can be reduced such that external quantum efficiency Q can improve in particular in the high-current range.

Furthermore, resonance effects can be more readily exploited by such a semiconductor layer sequence 2 as shown in FIG. 8. Intensity maxima of an optical field form a function of a distance from a mirror 5. At certain distances from the mirror 5, improved light outcoupling and enhanced radiant recombination, also known as the Purcell effect, occur in the quantum wells 33. As a rule, the quantum wells 33 are located at a resonance maximum as shown in FIG. 8A. FIG. 8B is another schematic representation of intensity I along the growth direction G of the semiconductor layer sequence 2.

Figure 8A:
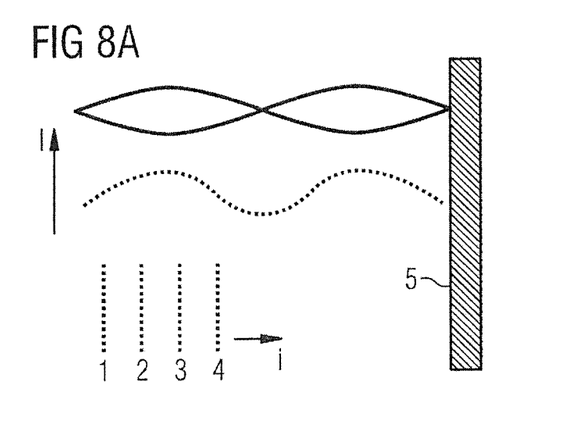
Figure 8B:
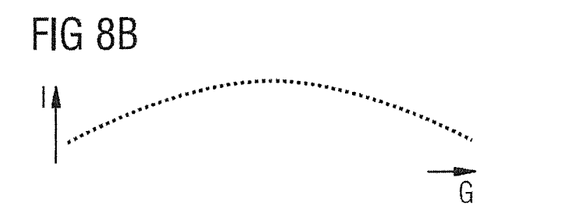
Figure 8C:
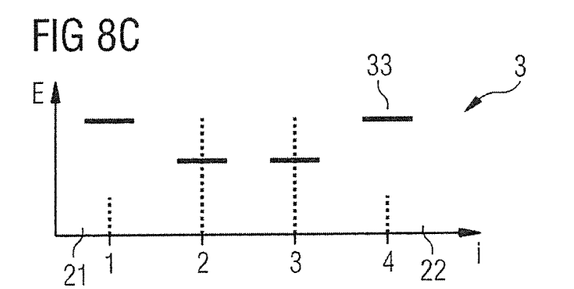

FIG. 8C shows the low-current range. In the low-current range, the holes are highly mobile and the holes are well distributed. Purposeful adjustment of the energy levels of the quantum wells 33 enhances clustering at the resonance maximum as shown in FIG. 8B, and improved external efficiency is achieved in the low-current range. Hole density is shown in a similar manner to FIG. 3 as a dashed line.

Figure 8D:
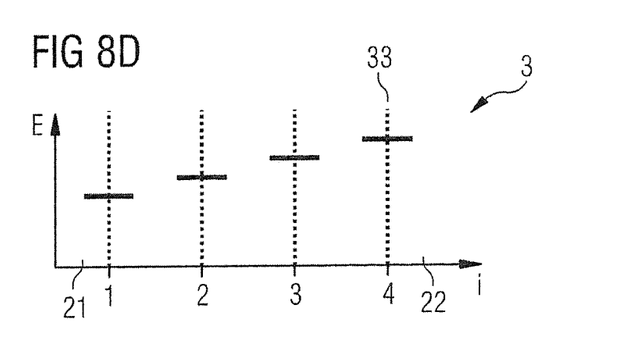

In the high-current range as shown in FIG. 8D, the holes are less mobile and clustering of holes at or close to the p-conductive layer 22 is prevented by the energy levels of the quantum wells 33 which decline in a direction towards the n-conductive layer 21. The more uniform charge carrier distribution gives rise to an overall lower charge carrier density of the quantum wells 33, in particular on the p-doped side 22. In this manner, efficiency can also be increased at relatively high current densities.

Figure 9A:
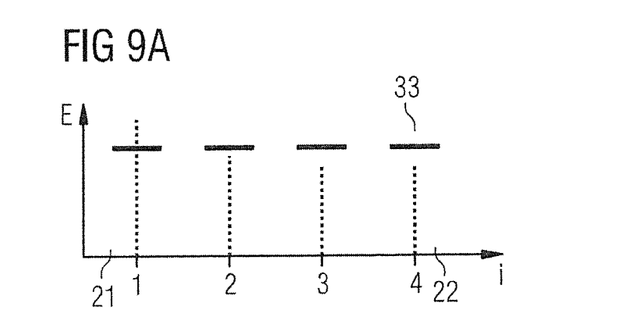
FIGS. 9A-9B are schematic diagrams of energy levels of a modification of a semiconductor layer sequence.
Figure 9B:
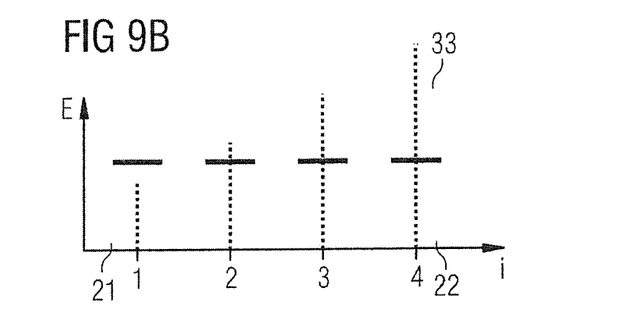

FIG. 9 shows hole distribution in the low-current case as shown in FIG. 9A, and in the high-current case as shown in FIG. 9B, for a modification of the semiconductor layer sequence. In this modification, all the quantum wells 33 have roughly identical energy levels. The holes are thus relatively non-uniformly distributed in the low-current range and in the high-current range. As a consequence, the efficiency of such a semiconductor layer sequence is comparatively low.

Our layer sequences and methods are not restricted by the description given with reference to the examples. Rather, this disclosure encompasses any novel feature and any combination of features, including in particular any combination of features in the appended claims, even if the feature or the combination is not itself explicitly indicated in the claims or examples.

The invention claimed is:

1. A semiconductor layer sequence for an optoelectronic semiconductor chip, which sequence comprises:
   an n-conductive layer;
   a p-conductive layer; and
   an active zone located therebetween,
   wherein
   the active zone comprises N successive quantum wells along a growth direction (G) with N≥2 and N∈$\mathbb{N}$, which each generate radiation and are consecutively numbered along the growth direction (G) with k∈[1; N]$\mathbb{N}$;
   the quantum wells are separated from one another by barrier layers;
   at a first working point (W1) at a first current density (C1), the quantum wells exhibit associated, consecutively numbered first emission wavelengths $L1_k$;
   at least two of the first emission wavelengths $L1_k$ of the quantum wells differ from one another;
   at a second working point (W2) at a second current density (C2), the quantum wells exhibit associated, consecutively numbered second emission wavelengths $L2_k$, at least some of which differ from the first emission wavelengths $L1_k$;
   the first current density (C1) is smaller than the second current density (C2) and the current densities (C1, C2) differ from one another at least by a factor of 2; and
   for at least one i and at least one j with i, j∈[1; N]$\mathbb{N}$, and i≠j, the following applies: $L1_i < L1_j$;
   the first current density (C1) is at most 3.5 A/cm² and the second current density (C2) at least 10 A/cm²;
   the quantum wells are based on InGaN;
   thicknesses (T) of the quantum wells are each 1.5 nm and 5 nm;
   thicknesses (B) of the barrier layers are each 3 nm to 12 nm and the barrier layers are based on GaN, AlGaN or InGaN;
   10≥N≥4;
   at the second working point (W2) for at least one i and at least one j, the following applies: $L2_i \geq L2_j$;
   for at least one i and at least one j a wavelength difference between $L1_i$ and $L1_j$ at the first working point (W1) is 1.5 nm to 12 nm;
   for at least one i and at least one j a wavelength difference between $L2_i$ and $L2_j$ at the second working point (W2) is 0.5 nm to 6 nm;
   at the first working point (W1) the emission wavelengths $L1_k$ of the quantum wells increase monotonically or strictly monotonically from the n-conductive layer towards the p-conductive layer and then decline monotonically or strictly monotonically towards the p-conductive layer; and
   the average thicknesses of the quantum wells in the active zone vary by a first factor of at least 1.2 and of at most 1.5 and the indium contents of the quantum wells in the active zone vary by a second factor of at least 1.005 and of at most 1.2.

2. The semiconductor layer sequence according to claim 1, wherein average thicknesses (T) of the quantum wells in the active zone vary by at least 0.1 nm and by at most 5.0 nm.

3. The semiconductor layer sequence according to claim 1, wherein indium contents of the quantum wells in the active zone vary by at least 0.05 atom percent and by at most 6 atom percent.

4. The semiconductor layer sequence according to claim 1, wherein the quantum wells are doped to different degrees.

5. The semiconductor layer sequence according to claim 1, wherein at least two of the barrier layers in the active zone are doped to different degrees and the emission wavelengths $L1_k$ of the quantum wells at the first working point (W1) are varied by the doping of these barrier layers.

6. The semiconductor layer sequence according to claim 1, wherein some of the barrier layers are based on AlGaN and others of the barrier layers are based on InGaN, AlInGaN or GaN.

7. A method in which an optoelectronic semiconductor chip with the semiconductor layer sequence according to claim 1 is operated comprising:
   periodically operating the semiconductor layer sequence at the first working point (W1) at the first current density (C1) and periodically at the second working point (W2) at the second current density (C2), wherein
   the first current density (C1) is smaller than the second current density (C2) and the current densities (C1, C2) differ from one another at least by a factor of 2; and
   for at least one i and at least one j with i, j∈[1; N]$\mathbb{N}$ and i≠j, the following applies: $L1_i < L1_j$ and $L2_i > L2_j$.

8. The method according to claim 7, wherein, as a function of current intensity, a wavelength profile from $L1_i$ towards $L2_i$ intersects with a wavelength profile from $L1_j$ to $L2_j$ if the current density is increased from the first towards the second working point (W1, W2), and
   on increasing current density from the first towards the second working point (W1, W2), mobility of positive charge carriers decreases in the active zone of the semiconductor layer sequence.

9. A semiconductor layer sequence for an optoelectronic semiconductor chip, which sequence comprises:
   an n-conductive layer;
   a p-conductive layer; and
   an active zone located therebetween,
   wherein
   the active zone comprises N successive quantum wells along a growth direction (G) with N≥2 and N∈$\mathbb{N}$, each generating radiation and consecutively numbered along the growth direction (G) with k∈[1; N]$\mathbb{N}$;
   the quantum wells are separated from one another by barrier layers;
   at a first working point (W1) at a first current density (C1), the quantum wells exhibit associated, consecutively numbered first emission wavelengths $L1_k$;
   at least two of the first emission wavelengths $L1_k$ of the quantum wells differ from one another;
   at a second working point (W2) at a second current density (C2), the quantum wells exhibit associated, consecutively numbered second emission wavelengths $L2_k$, at least some of which differ from the first emission wavelengths $L1_k$;
   the first current density (C1) is smaller than the second current density (C2) and the current densities (C1, C2) differ from one another at least by a factor of 2; and
   for at least one i and at least one j with i, j∈[1; N]$\mathbb{N}$ and i≠j, the following applies: $L1_i < L1_j$ and $L2_i \geq L2_j$.

10. The semiconductor layer sequence according to claim 9, wherein
   the first current density (C1) is at most 3.5 A/cm² and the second current density (C2) at least 10 A/cm²;
   the quantum wells are based on InGaN;
   thicknesses (T) of the quantum wells are each 1.5 nm to 5 nm;

thicknesses (B) of the barrier layers are each 3 nm to 12 nm and the barrier layers are based on GaN, AlGaN or InGaN;

10>N≥4;

at the second working point (W2) for at least one i and at least one j, the following applies: $L2_i > L2_j$;

for at least one i and at least one j a wavelength difference between $L1_i$ and $L1_j$ at the first working point (W1) is 1.5 nm to 12 nm; and for at least one i and at least one j a wavelength difference between $L2_i$ and $L2_j$ at the second working point (W2) is 0.5 nm to 6 nm.

11. The semiconductor layer sequence according to claim 9, wherein at the first working point (W1), the emission wavelength $L1_k$ of the quantum wells increase monotonically or strictly monotonically from the n-conductive layer towards the p-conductive layer.

12. The semiconductor layer sequence according to claim 9, wherein at the first working point (W1), the emission wavelengths $L1_k$ of the quantum wells increase monotonically or strictly monotonically from the n-conductive layer towards the p-conductive layer and then decline monotonically or strictly monotonically towards the p-conductive layer.

13. The semiconductor layer sequence according to claim 9, wherein at the second working point (W2), the emission wavelengths $L2_k$ of the quantum wells decline monotonically or strictly monotonically from the n-conductive layer towards the p-conductive layer.

14. The semiconductor layer sequence according to claim 9, wherein the average thicknesses of the quantum wells in the active zone vary by a first factor of at least 1.05 and of at most 3, and/or in which the indium contents of the quantum wells in the active zone vary by a second factor of at least 1.001 and of at most 2.

* * * * *

UNITED STATES PATENT AND TRADEMARK OFFICE
CERTIFICATE OF CORRECTION

PATENT NO.         : 9,553,231 B2                                    Page 1 of 1
APPLICATION NO.    : 14/769831
DATED              : January 24, 2017
INVENTOR(S)        : Meyer et al.

It is certified that error appears in the above-identified patent and that said Letters Patent is hereby corrected as shown below:

In the Claims

Column 11, Line 12, Claim 1 change "[1; N]$\mathbb{N}$" to -- [1; N]$_\mathbb{N}$ --; at Line 28, change "[1; N]$\mathbb{N}$" to -- [1; N]$_\mathbb{N}$ --; and Line 33, change "and" to -- to --.

Column 12, Line 21, Claim 1 change "[1; N]$\mathbb{N}$" to -- [1; N]$_\mathbb{N}$ --; at Line 42, change "[1; N]$\mathbb{N}$" to --[1; N]$_\mathbb{N}$ --; and Line 59, change "[1; N]$\mathbb{N}$" to -- [1; N]$_\mathbb{N}$ --.

Signed and Sealed this
Thirtieth Day of May, 2017

Michelle K. Lee
*Director of the United States Patent and Trademark Office*